US011112107B2

(12) United States Patent
Cho et al.

(10) Patent No.: US 11,112,107 B2
(45) Date of Patent: Sep. 7, 2021

(54) DISPLAY APPARATUS

(71) Applicant: SAMSUNG ELECTRONICS CO., LTD., Suwon-si (KR)

(72) Inventors: Juwon Cho, Suwon-si (KR); Kihong Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/928,785

(22) Filed: Jul. 14, 2020

(65) Prior Publication Data

US 2021/0199280 A1    Jul. 1, 2021

(30) Foreign Application Priority Data

Dec. 26, 2019   (KR) .................. 10-2019-0175695

(51) Int. Cl.
*F21V 33/00*   (2006.01)
*F21V 8/00*    (2006.01)
(Continued)

(52) U.S. Cl.
CPC .......... *F21V 33/0052* (2013.01); *A47F 11/10* (2013.01); *F21V 7/0033* (2013.01);
(Continued)

(58) Field of Classification Search
CPC ...... F21V 33/0052; F21V 7/0033; F21V 7/05; F21V 23/003; F21V 23/0442;
(Continued)

(56) References Cited

U.S. PATENT DOCUMENTS 7,050,207 B1    5/2006  Hiraga et al.
10,636,385 B2 * 4/2020  Jung .................. A63F 13/424
(Continued)

FOREIGN PATENT DOCUMENTS

KR          101022799 B1    3/2011
KR      10-2011-0061729 A   6/2011
(Continued)

OTHER PUBLICATIONS

"A cradle stand installable on desks and tables for 15-17 inch LCD and LED monitors [ET-02C]". Mediafirst, Sep. 9, 2019, http://haeri597.checkoutshop.co.kr/goods/view.php?goodsno=1000721. (14 pages total).

(Continued)

*Primary Examiner* — Bao Q Truong
(74) *Attorney, Agent, or Firm* — Sughrue Mion, PLLC

(57) ABSTRACT

A display apparatus includes a display panel supported within a case having a rear surface including a circular recessed portion. An annular total reflection mirror and an annular half mirror are disposed in the circular recessed portion with an annular light source provided therebetween. A pattern forming member is disposed on an outer side of the annular half mirror and is configured to be reflected by the annular total reflection mirror. A pattern light source is configured to supply light to the pattern forming member so that the pattern is reflected on the annular total reflection mirror. When the annular light source and the pattern light source are turned on, the pattern of the pattern forming member is reflected between the annular total reflection mirror and the annular half mirror.

20 Claims, 18 Drawing Sheets

(51) Int. Cl.
*F21V 23/00* (2015.01)
*F21V 23/04* (2006.01)
*F21V 7/00* (2006.01)
*H05K 5/02* (2006.01)
*G09F 13/00* (2006.01)
*A47F 11/10* (2006.01)
*G09F 13/12* (2006.01)
*F21V 7/05* (2006.01)
*F21Y 115/10* (2016.01)
*F21Y 105/18* (2016.01)
*F21W 121/00* (2006.01)
*G09F 13/04* (2006.01)

(52) U.S. Cl.
CPC .............. *F21V 7/05* (2013.01); *F21V 23/003* (2013.01); *F21V 23/0442* (2013.01); *G02B 6/0045* (2013.01); *G02B 6/0091* (2013.01); *G09F 13/005* (2013.01); *G09F 13/12* (2013.01); *H05K 5/0204* (2013.01); *H05K 5/0234* (2013.01); *F21W 2121/00* (2013.01); *F21Y 2105/18* (2016.08); *F21Y 2115/10* (2016.08); *G09F 13/0422* (2021.05)

(58) Field of Classification Search
CPC ..... A47F 11/10; G02B 6/0045; G02B 6/0091; G09F 13/005; G09F 13/12; G09F 13/0422; H05K 5/0204; H05K 5/0234; F21Y 2105/18; F21Y 2115/10; F21W 2121/00

See application file for complete search history.

(56) References Cited

U.S. PATENT DOCUMENTS

| | | |
|---|---|---|
| 2006/0109657 A1 | 5/2006 | Kuhl |
| 2015/0346413 A1 | 12/2015 | Kadoriku et al. |
| 2017/0154607 A1 | 6/2017 | Jung et al. |

FOREIGN PATENT DOCUMENTS

| | | |
|---|---|---|
| KR | 10-2011-0083974 A | 7/2011 |
| KR | 200463584 Y1 | 11/2012 |
| KR | 10-2014-0056906 A | 5/2014 |
| KR | 1020140056908 A | 5/2014 |
| KR | 1020170064261 A | 6/2017 |

OTHER PUBLICATIONS

International Search Report dated Apr. 14, 2021 issued by the International Searching Authority in International Application No. PCT/KR2020/018632 (PCT/ISA/210).
International Written Opinion dated Apr. 14, 2021 issued by the International Searching Authority in International Application No. PCT/KR2020/018632 (PCT/ISA/237).

* cited by examiner

DISPLAY APPARATUS

CROSS-REFERENCE TO RELATED APPLICATIONS

This application is based on and claims priority under 35 U. S.C. § 119 to Korean Patent Application No. 10-2019-0175695, filed on Dec. 26, 2019, in the Korean Intellectual Property Office, the disclosure of which is incorporated by reference herein in its entirety.

BACKGROUND

1. Field

The disclosure relates to a display apparatus, and more particularly, to a display apparatus having a decorative lighting device on a rear surface of a case.

2. Description of Related Art

Generally, gaming monitors that may be used when playing computer games are commercially available.

Gaming monitors often expose the back of their case to an audience. Therefore, gaming monitors often have back cases provided with various decorations thereon.

For example, a related art gaming monitor has a plurality of light emitting diodes (LEDs) arranged on the rear surface of the case as dots, lines, surfaces, and the like to give a decorative effect.

Recently, the rear surfaces of display apparatuses such as computer monitors or televisions (TVs) used in homes or offices are often exposed toward the center of or interior of the room rather than toward the wall.

Therefore, it is desired to provide a lighting device that may give a decorative effect for the interior to the rear surface of the display apparatus.

SUMMARY

Provided is a display apparatus having a decorative lighting device capable of giving a decorative effect to the rear surface thereof.

Also provided is a display apparatus having a slide clamp capable of adjusting a distance between a user and the display apparatus.

According to an aspect of the disclosure, there is provided a display apparatus including: a display panel; a case in which the display panel is accommodated, the case having a rear surface defining a circular recessed portion; an annular total reflection mirror disposed in the circular recessed portion; an annular half mirror disposed in the circular recessed portion on an outer side of the annular total reflection mirror; an annular light source disposed in the circular recessed portion between the annular total reflection mirror and the annular half mirror; a pattern forming member disposed in the circular recessed portion on an outer side of the annular half mirror, the pattern forming member being inclined at an acute angle with respect to the annular half mirror being formed of a transparent material, and including a pattern provided on at least one surface thereof and a pattern light source configured to supply light to the pattern forming member so that the pattern is reflected on the annular total reflection mirror, wherein when the annular light source and the pattern light source are turned on, the pattern of the pattern forming member is reflected between the annular total reflection mirror and the annular half mirror.

The pattern forming member may include a light guide disposed in a central aperture of the annular half mirror and having a hollow cylindrical shape, and wherein the pattern light source is disposed at one end of the light guide.

The pattern light source may include: a plurality of pattern light emitting diodes (LEDs) facing the one end of the light guide and disposed at regular intervals; and a pattern printed circuit board on which the plurality of pattern LEDs are disposed.

The pattern is provided on a front surface and a rear surface of the pattern forming member.

The pattern forming member has a funnel shape that tapers outward, and a diameter of an outer end of the pattern forming member may be less than a diameter of a circle located at a center between an inner diameter of the annular half mirror and an outer diameter of the annular half mirror.

The annular light source may include: an annular member disposed between the annular half mirror and the annular total reflection mirror, the annular member being configured to guide light; a plurality of light emitting diodes (LEDs) disposed at regular intervals along an outer circumferential surface of the annular member, the plurality of LEDs configured to emit light toward the outer circumferential surface of the annular member; and an annular printed circuit board on which the plurality of LEDs are disposed.

The pattern forming member may be inclined at an angle within a range of 30 degrees to 70 degree with respect to the annular half mirror.

The annular light source and the pattern light source are provided on a single printed circuit board.

The annular light source may include: a plurality of first light emitting diodes (LEDs) disposed circumferentially around the printed circuit board at regular intervals; and a curved light guide member having one end facing the plurality of first LEDs and another end positioned between the annular half mirror and the annular total reflection mirror, wherein the curved light guide member may be configured to guide light emitted from the plurality of first LEDs between the annular total reflection mirror and the annular half mirror.

The pattern light source may include a plurality of second LEDs disposed circumferentially around the printed circuit board at regular intervals, the plurality of second LEDs forming a circle having a smaller diameter than a circle formed by the plurality of first LEDs.

The display apparatus may further include a processor configured to control the annular light source and the pattern light source.

The processor may be further configured to control the annular light source and the pattern light source to perform at least one of static lighting, breath lighting, flash lighting, rainbow lighting, and rotation lighting.

The display apparatus may further include a sound sensor configured to detect an external sound, and the processor may be further configured to control turn on and off controls the annular light source and the pattern light source based on a signal input from the sound sensor.

The display apparatus may further include a stand coupler provided at a bottom of the circular recessed portion of the case; and a stand configured to be coupled to the stand coupler and to support the case.

The stand may include a neck detachably coupled to the stand coupler; and a base detachably coupled to a lower end of the neck.

The base may include: a center portion; two legs extending from the center portion at an obtuse angle with respect to each other; and an insertion protrusion extending upwardly from the center portion, wherein the lower end of the neck defines an insertion groove in which the insertion protrusion is inserted.

The base may include: a clamp configured to be fixed to a fixed object, the clamp having a top plate; a first slide member slidably connected to the top plate of the clamp; a second slide member slidably connected to the first slide member; and an insertion protrusion protruding from the second slide member, wherein the lower end of the neck defines an insertion groove in which the insertion protrusion is inserted.

The second slide member may be configured to lock in at least three places with respect to the clamp.

The first slide member may include: a slide body configured to slide along a first guide groove formed on the top plate of the clamp; a rear end support portion provided at a first end of the slide body, the rear end support portion being positioned below the top plate of the clamp and having a diameter greater than a width of the first guide groove; and a front end support portion provided at a second end of the slide body, the front end support portion having a diameter greater than the width of the first guide groove and being coupled to the second slide member.

The second slide member may include: a support guide groove formed in an elongated hole defined by the second slide member, the support guide groove being configured to receive the front end support portion of the first slide member; and a second guide groove formed on a bottom surface of the support guide groove, the second guide groove being configured to receive the slide body of the first slide member.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
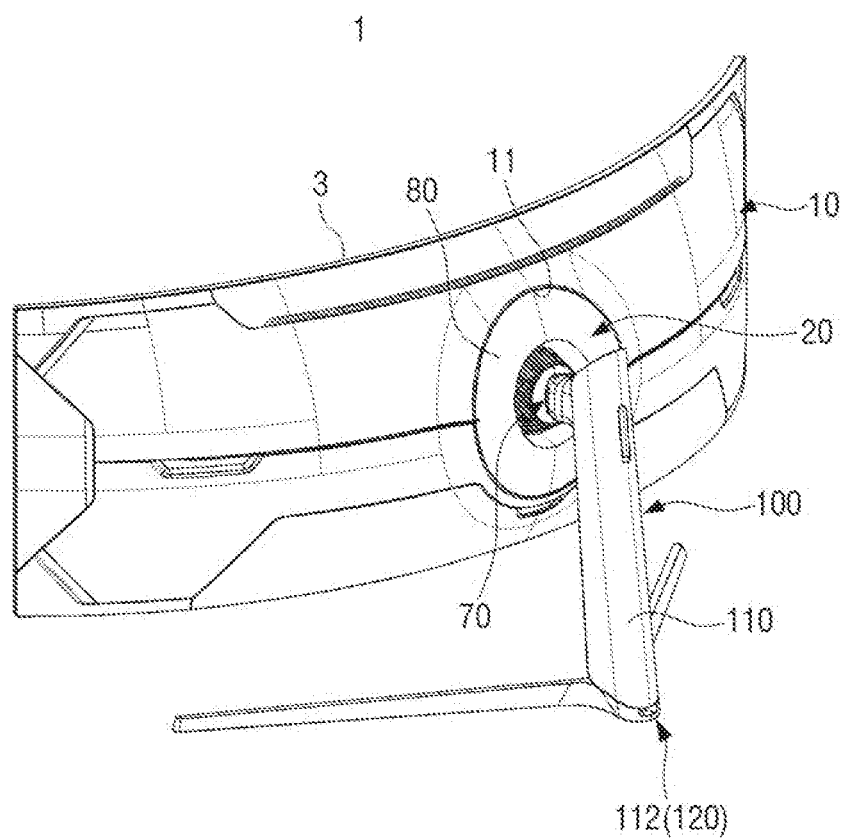
FIG. 1 is a perspective view illustrating a display apparatus according to an embodiment.

Various embodiments of the disclosure will hereinafter be described with reference to the accompanying drawings. However, it is to be understood that technologies mentioned in the disclosure are not limited to specific embodiments, but include various modifications, equivalents, and/or alternatives according to embodiments of the disclosure. Throughout the accompanying drawings, similar components will be denoted by similar reference numerals. Further, the accompanying drawings are not illustrated to scale, but sizes of some of components may be exaggerated to assist in the understanding of the disclosure.

In addition, expressions "first", "second", or the like, used in the disclosure may indicate various components regardless of a sequence and/or importance of the components, will be used only to distinguish one component from the other components, and do not limit the corresponding components. For example, a first user device and a second user device may indicate different user devices regardless of a sequence or importance thereof. For example, a first component may be named a second component and the second component may also be similarly named the first component, without departing from the scope of the disclosure.

Terms used in the disclosure may be used only to describe specific embodiments rather than restricting the scope of other embodiments. Singular forms may include plural forms unless the context clearly indicates otherwise. Terms used in the specification including technical and scientific terms have the same meanings as those that are generally understood by those skilled in the art to which the disclosure pertains . Terms defined in a general dictionary among terms used in the disclosure may be interpreted as meanings that are the same as or similar to meanings within a context of the related art, and are not interpreted as ideal or excessively formal meanings unless clearly defined in the disclosure. In some cases, terms may not be interpreted to exclude embodiments of the disclosure even though they are defined in the disclosure.

Further, the terms 'leading end', 'rear end', 'upper side', 'lower side', 'top end', 'bottom end', etc. used in the present disclosure are defined with reference to the drawings. However, the shape and position of each component are not limited by the terms.

Figure 2:
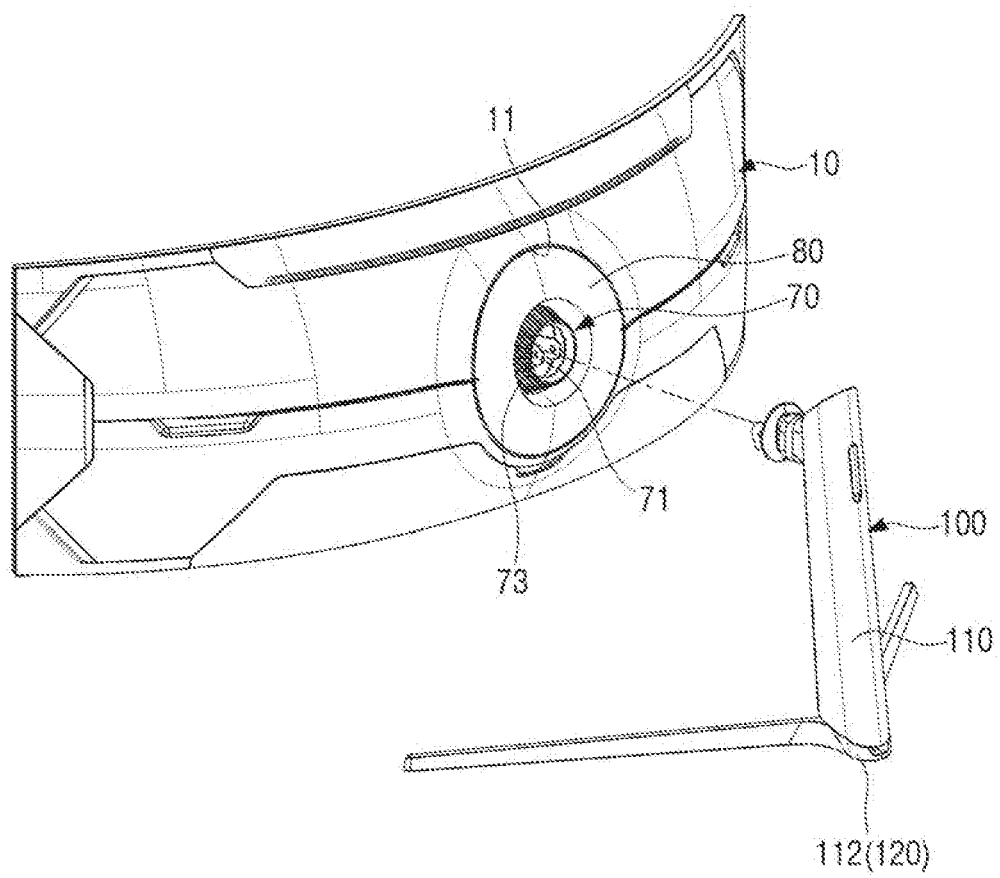
FIG. 2 is a perspective view illustrating a state in which a stand is separated from the display apparatus of FIG. 1.

FIG. 1 is a perspective view illustrating a display apparatus according to an embodiment. FIG. 2 is a perspective view illustrating a state in which a stand is separated from the display apparatus of FIG. 1.

Referring to FIGS. 1 and 2, a display apparatus 1 may include a display panel and a case 10.

The display panel displays an image and is exposed on the front surface 3 of the display apparatus 1. Various types of display panels such as liquid crystal display panels, organic light emitting diode (LED) panels, quantum dot light emitting diode panels, and micro LED panels according to the related art may be used as the display panel; therefore, a detailed description thereof is omitted.

The case 10 is configured to accommodate or house the display panel. An opening in which a display surface of the display panel is exposed may be provided on the front surface 3 of the case 10. A stand 100 for supporting the case 10 may be disposed at the rear surface of the case 10. The stand 100 may be detachably connected to the rear surface of the case 10.

In addition, a circular recessed portion 11 in which a decorative lighting device 20 is disposed may be provided on the rear surface of the case 10. A stand coupling portion (or a stand coupler) 70 to which one end of the stand 100 is fixed may be provided at the center of the bottom of the circular recessed portion 11.

The stand coupling portion 70 may include a fixed bracket 71 to which one end of the stand 100 may be fixed and may be provided on the bottom of the circular recessed portion 11. A bracket cover 73 may be provided to surround the fixed bracket 71. The bracket cover 73 may include a reflective absorption pattern 74. The reflective absorption pattern 74 may be formed along the entire circumference of the outer circumferential surface of the bracket cover 73.

Figure 3:
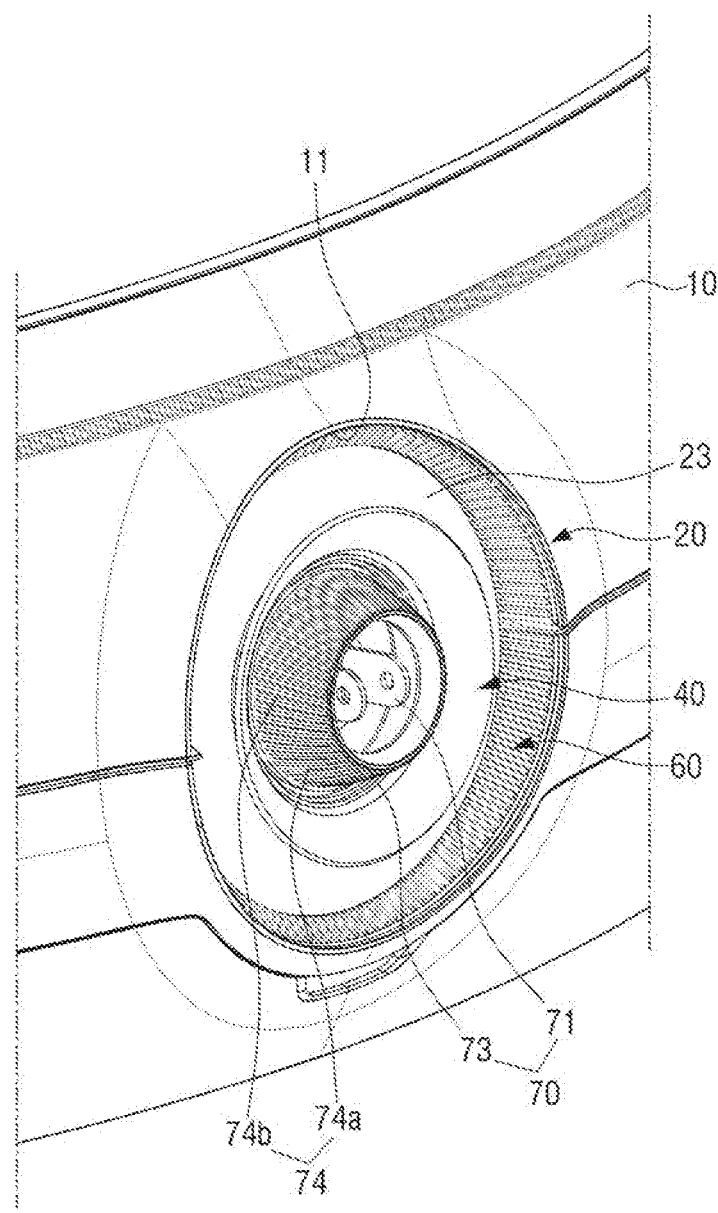
FIG. 3 is a partial perspective view illustrating a decorative lighting device provided on a rear surface of a display apparatus from which a stand is removed according to an embodiment.

The reflective absorption pattern 74 may be formed to absorb a portion of incident light and reflect the remainder of the incident light. For example, as shown in FIG. 3, the reflective absorption pattern 74 may be formed of a plurality of semi-cylindrical protrusions 74a provided at regular intervals on the outer circumferential surface of the bracket cover 73. The plurality of semi-cylindrical protrusions 74a may be formed parallel to each other in the height direction of the bracket cover 73. When the plurality of semi-cylindrical protrusions 74a are formed on the outer circumferential surface of the bracket cover 73 as described above, the plurality of semi-cylindrical protrusions 74a reflect light and a plurality of grooves 74b formed between the plurality of semi-cylindrical protrusions 74a absorb light.

As another example, the reflective absorption pattern 74 may be formed by painting the outer circumferential surface of the bracket cover 73. In other words, matte paint and glaze paint may be alternatingly applied in a stripe form on the outer circumferential surface of the bracket cover 73 to form the reflective absorption pattern 74. Thus, portions of the bracket cover 73 coated with the glaze paint will reflect light, and portions of the bracket cover 73 coated with the matte paint will absorb light.

FIGS. 1 and 2 show the display apparatus 1 including a curved display panel and the case 10 accommodating the curved display panel, but the display apparatus to which the disclosure is applied is not limited thereto. the present disclosure may be applied to a display apparatus using a flat display panel.

Hereinafter, the decorative lighting device 20 of the display apparatus 1 according to an embodiment will be described in detail with reference to FIGS. 3, 4, and 5.

FIG. 3 is a partial perspective view illustrating a decorative lighting device provided on a back surface of a display apparatus according to an embodiment from which a stand is removed. FIG. 4 is a cross-sectional perspective view illustrating the decorative lighting device of the display apparatus of FIG. 3. FIG. 5 is an exploded perspective view illustrating the decorative lighting device of the display apparatus of FIG. 3.

Figure 4:
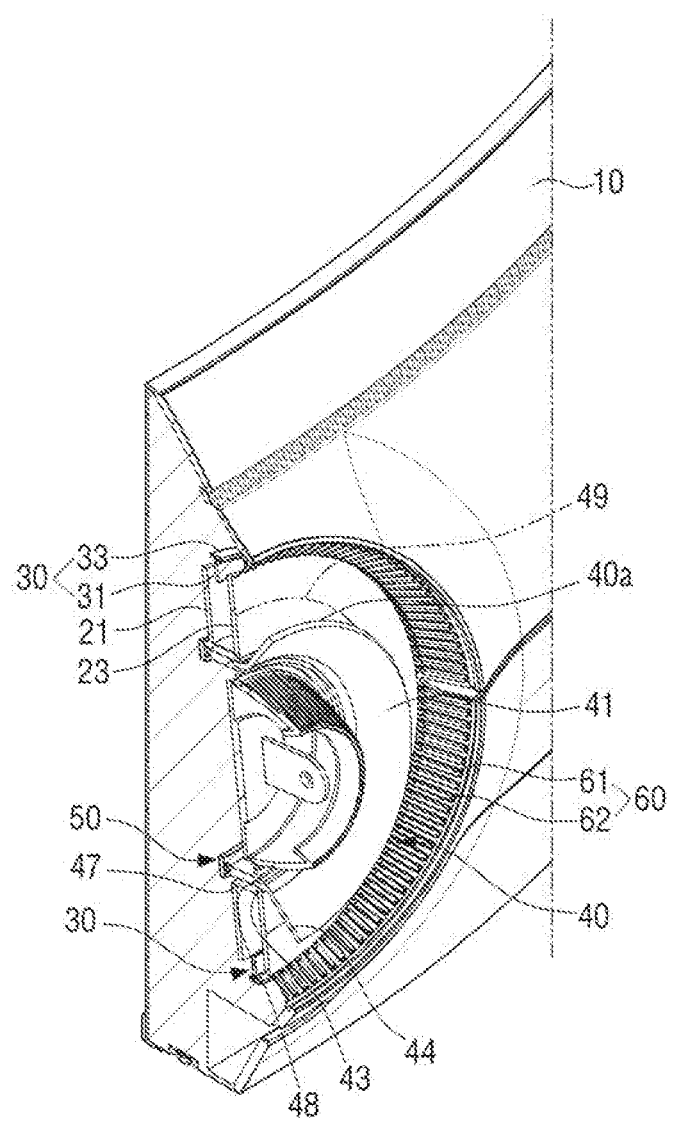
FIG. 4 is a cross-sectional perspective view illustrating the decorative lighting device of the display apparatus of FIG. 3.
Figure 5:
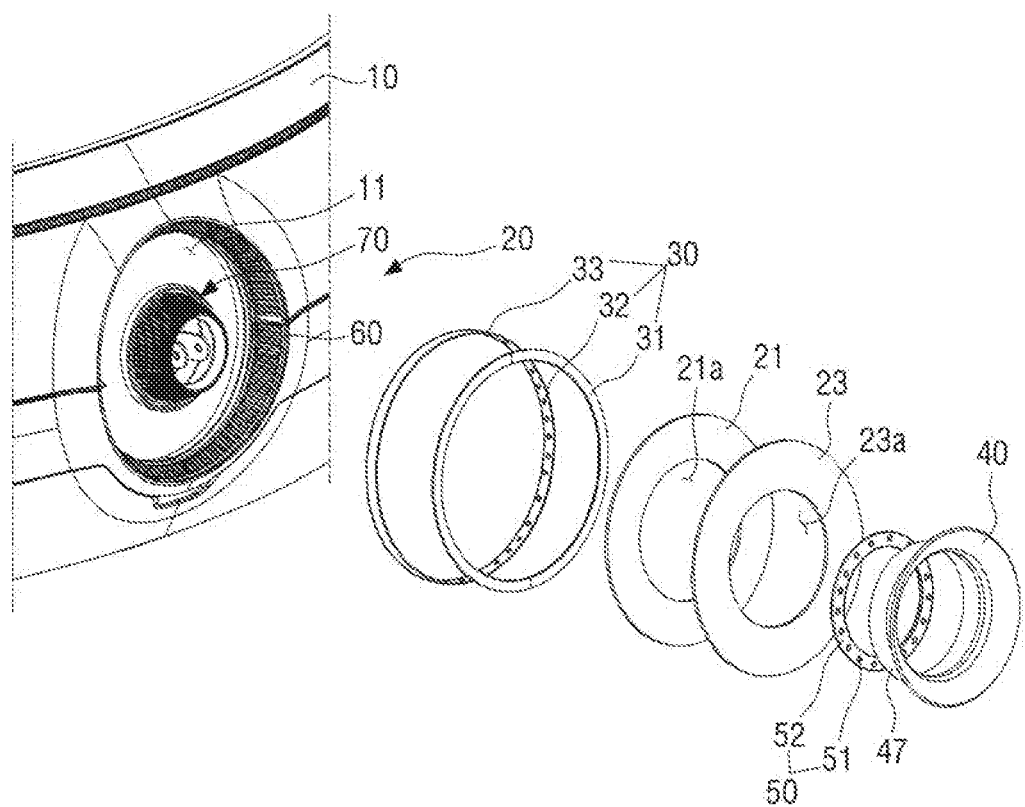
FIG. 5 is an exploded perspective view illustrating the decorative lighting device of the display apparatus of FIG. 3.

Referring to FIGS. 3, 4, and 5, the decorative lighting device 20 of the display apparatus 1 according to an embodiment may include an annular total reflection mirror 21, an annular half mirror 23, an annular light source 30, a pattern forming member 40, and a pattern light source 50.

The annular total reflection mirror 21 is configured to totally reflect the incident light, and is provided with a circular through hole 21a at its center. The annular total reflection mirror 21 is disposed in the circular recessed portion 11 provided on the rear surface of the case 10 of the display apparatus 1. For example, the annular total reflection mirror 21 may be disposed on the bottom of the circular recessed portion 11 provided on the rear surface of the case 10. The annular total reflection mirror 21 may be disposed in the circular recessed portion 11 so that the reflective surface thereof faces the away from the case 10.

The outer diameter (Do) of the annular total reflection mirror 21 is formed to have a size smaller than the diameter of the circular recessed portion 11 so that the annular total reflection mirror 21 may be inserted into the circular recessed portion 11. The inner diameter (Di) of the annular total reflection minor 21, that is, the diameter of the through hole 21a, is formed to have a larger size than the outer diameter (Dpo) of the pattern forming member 40. Therefore, the pattern forming member 40 may be inserted into the through hole 21a of the annular total reflection minor 21.

The annular half minor 23 is configured to reflect a portion of the incident light and transmit the remainder of the incident light, and may be provided with a circular through hole 23a at its center. The annular half mirror 23 is disposed in the circular recessed portion 11 of the case 10 of the display apparatus 1, may be spaced apart by a predetermined distance from the annular total reflection minor 21, and may be parallel with the annular total reflection mirror 21.

For example, the annular half minor 23 may be disposed parallel to the annular total reflection minor 21 and positioned in front of the annular total reflection minor 21. The annular half minor 23 may be disposed at a predetermined distance from the annular total reflection minor 21, and the reflective surface of the annular half mirror 23 and the reflective surface of the annular total reflection mirror 21 may face each other, thereby forming an infinity mirror. Accordingly, the image transmitted through the annular half minor 23 may be infinitely reflected between the annular total reflection mirror 21 and the annular half mirror 23.

The annular half minor 23 may have an outer diameter (Dho) of a size corresponding to the outer diameter (Do) of the annular total reflection minor 21. In other words, the outer diameter (Dho) of the annular half mirror 23 may be smaller than the diameter of the circular recessed portion 11 so that the annular half mirror 23 may be inserted into the circular recessed portion 11 of the case 10.

In addition, the annular half mirror 23 may have an inner diameter (Dhi) of a size corresponding to the inner diameter (Di) of the annular total reflection minor 21. In other words, the inner diameter (Dhi) of the annular half mirror 23, that is, the diameter of the through hole 23a may have a larger size than the outer diameter (Dpo) of one end of the pattern forming member 40. Therefore, the pattern forming member 40 may be inserted into the through hole 23a of the annular half mirror 23.

The annular light source 30 may be disposed between the annular total reflection mirror 21 and the annular half mirror 23. The annular light source 30 may be disposed to supply light to the space between the annular total reflection mirror 21 and the annular half mirror 23. For example, the annular light source 30 may be disposed adjacent to the edges of the annular total reflection mirror 21 and the annular half mirror 23.

The annular light source 30 may include an annular member 31, a plurality of light emitting diodes (LEDs) 32, and an annular printed circuit board 33.

The annular member 31 may be formed to guide the light emitted from the plurality of LEDs 32 and may be disposed between the back surface of the annular total reflection mirror 21 and the front surface of the annular half mirror 23. That is, the annular member 31 may be disposed in between the annular half mirror 23 and the annular total reflection mirror 21.

A portion of the annular member 31 may overlap the annular half mirror 23 and the annular total reflection mirror 21, and the rest of the annular member 31 may protrude from the annular half mirror 23 and the annular total reflection mirror 21.

In other words, the annular member 31 may have a ring shape, and the outer diameter thereof may be equal to or larger than the outer diameter (Dho) of the annular half mirror 23. In addition, the inner diameter of the annular member 31 may be larger than the inner diameter (Dhi) and smaller than the outer diameter (Dho) of the annular half mirror 23.

The annular member 31 may be formed of a transparent material or a translucent material through which light can pass. Therefore, light incident on the outer circumferential surface of the annular member 31 may be emitted to the outside (i.e., outward) through both side surfaces of the annular member 31.

The plurality of LEDs 32 may be disposed at regular intervals along the outer circumferential surface of the annular member 31 and may be formed to emit light toward the outer circumferential surface of the annular member 31. In other words, the plurality of LEDs 32 may face the outer circumferential surface of the annular member 31 and may be disposed on the annular printed circuit board 33 at regular intervals.

Therefore, the light emitted from the plurality of LEDs 32 may be incident to the outer circumferential surface of the annular member 31 and emitted to the outside through both side surfaces of the annular member 31. In other words, a part of the light transmitted from the plurality of LEDs 32 to the outer circumferential surface of the annular member 31 may be emitted toward the annular total reflection mirror 21 through one side surface of the annular member 31, and the rest of the light may be emitted toward the annular half mirror 23 through the other side surface of the annular member 31.

The annular printed circuit board 33 may be formed in a hollow cylindrical shape to support the plurality of LEDs 32, and the plurality of LEDs 32 may be disposed on the inner surface of the annular printed circuit board 33. The annular printed circuit board 33 may be provided with an electronic circuit that supplies power to the plurality of LEDs 32 and controls each of the plurality of LEDs 32. Accordingly, a processor 90 (see FIG. 9) may individually control the plurality of LEDs 32 through the annular printed circuit board 33.

The annular printed circuit board 33 may be fixed to the side surface or the bottom of the circular recessed portion 11 of the case 10.

The pattern forming member 40 may include a pattern that may be reflected by the annular total reflection mirror 21 and the annular half mirror 23, and may be disposed so that the pattern is reflected by the annular total reflection minor 21 and the annular half mirror 23.

For example, the pattern forming member 40 may be disposed in the through hole 23a of the annular half mirror 23, and may be provided above the annular half minor 23 to form an acute angle with the annular half minor 23. The pattern forming member 40 may be formed to be inclined at an angle θ of about 30 degrees to about 70 degrees with respect to the annular half mirror 23.

The leading end 40a of the pattern forming member 40 may be formed so as not to exceed the center circle 49 of the annular half mirror 23. Here, the center circle 49 of the annular half mirror 23 refers to a virtual circle located at the center between the outer circumferential surface and the inner circumferential surface of the annular half mirror 23.

Figure 6A:
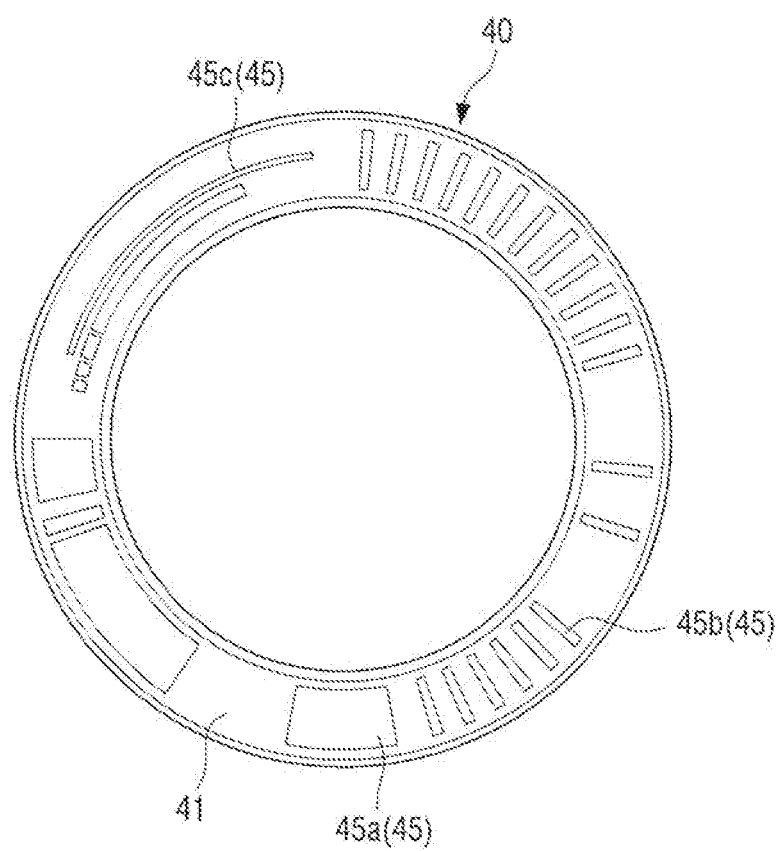
FIG. 6A is a front view illustrating a pattern forming member of a decorative lighting device according to an embodiment.
Figure 6B:
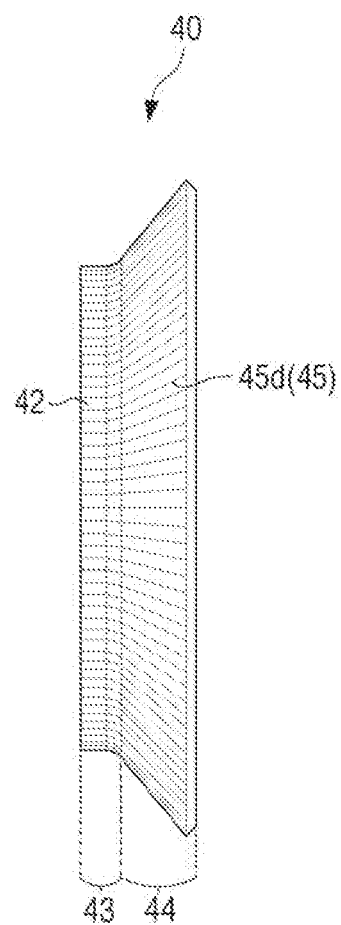
FIG. 6B is a side view illustrating a pattern forming member of a decorative lighting device according to an embodiment.
Figure 6C:
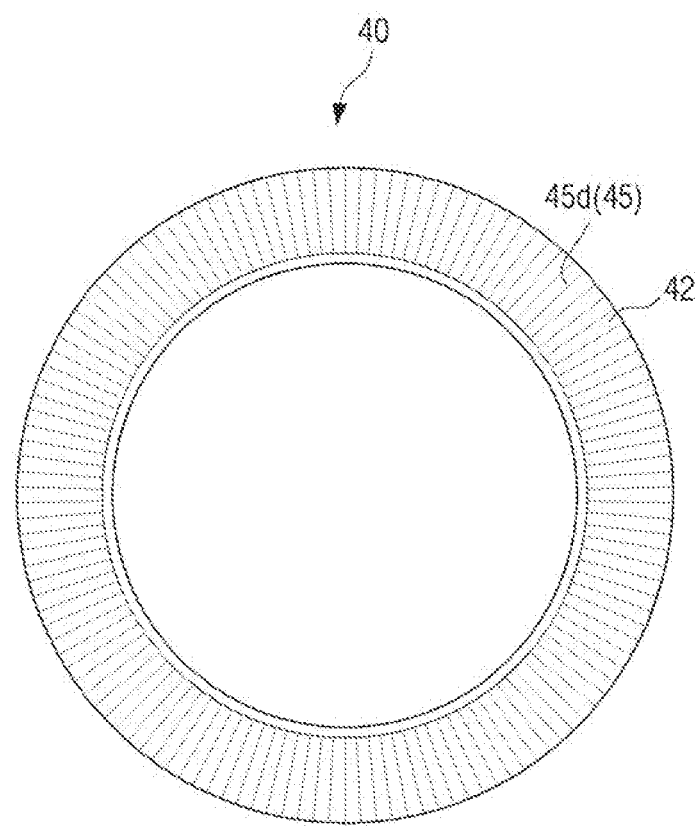
FIG. 6C is a rear view illustrating a pattern forming member of a decorative lighting device according to an embodiment.

The pattern forming member 40 may be formed of a transparent material, and patterns 45 to be reflected by the annular total reflection mirror 21 may be formed on a front surface 41 of the pattern forming member 40 (see FIG. 6A) and a rear surface 42 of the pattern forming member 40 (see FIGS. 6B and 6C).

The pattern forming member 40 may have a funnel shape. For example, the pattern forming member 40 may include a cylindrical portion 43 formed in a hollow cylinder and a diverging portion 44 tapering out from an outer end of the cylindrical portion 43.

The cylindrical portion 43 may be inserted into the through hole 23a of the annular half mirror 23. The outer circumferential surface of the cylindrical portion 43 may be formed to be in contact with or adjacent to the inner circumferential surface of the annular half mirror 23.

The diverging portion 44 may be inclined from about 30 degrees to about 70 degrees with respect to a broad surface of the annular half mirror 23. For example, the diverging portion 44 may be inclined about 45 degrees with respect to the rear surface of the annular half mirror 23.

Various patterns 45 may be formed on the front surface 41 and the rear surface 42 of the pattern forming member 40. For example, as illustrated in FIGS. 6A to 6C, the patterns 45 may be formed on the pattern forming member 40.

FIG. 6A is a front view illustrating a pattern forming member of a decorative lighting device according to an embodiment. FIG. 6B is a side view illustrating a pattern forming member of a decorative lighting device according to an embodiment. FIG. 6C is a rear view illustrating a pattern forming member of a decorative lighting device according to an embodiment.

Referring to FIG. 6A, the patterns 45, including a plurality of rectangles 45a, 45b, and 45c having different sizes and shapes, may be formed on the front surface 41 of the pattern forming member 40 which is exposed to the outside of the circular recessed portion 11 of the case 10.

Referring to FIGS. 6B and 6C, the patterns 45, including a plurality of lines 45d, may be formed at regular intervals on the rear surface 42 of the pattern forming member 40.

As illustrated in FIGS. 6A and 6C, the patterns 45 formed on the front surface 41 and the rear surface 42 of the pattern forming member 40 may have different shapes.

The patterns 45 of the pattern forming member 40 may be formed in various ways. In the case of the embodiment shown in FIGS. 6A, 6B, and 6C, when the pattern forming member 40 is injected, the patterns 45 of the front surface 41 and the rear surface 42 may be formed integrally with the pattern forming member 40. In this case, the patterns may be formed by etching the surface of the cavity of a mold configured to form the pattern forming member 40. Thus, when the pattern forming member 40 is injected, the patterns 45 of the front surface 41 and the rear surface 42 of the pattern forming member 40 may be formed together with the pattern forming member 40.

As another example, the patterns 45 may be formed on the front surface 41 and the rear surface 42 of the pattern forming member 40 by laser processing. As another example, the patterns 45 may be formed on the front surface 41 and the rear surface 42 of the pattern forming member 40 by using paint.

In the above description, the patterns 45 are formed on both the front surface 41 and the rear surface 42 of the pattern forming member 40, but the patterns 45 of the pattern forming member 40 are not limited thereto. For example, the pattern forming member 40 may include the patterns 45 formed only on one of the front surface 41 and the rear surface 42.

Figure 7:
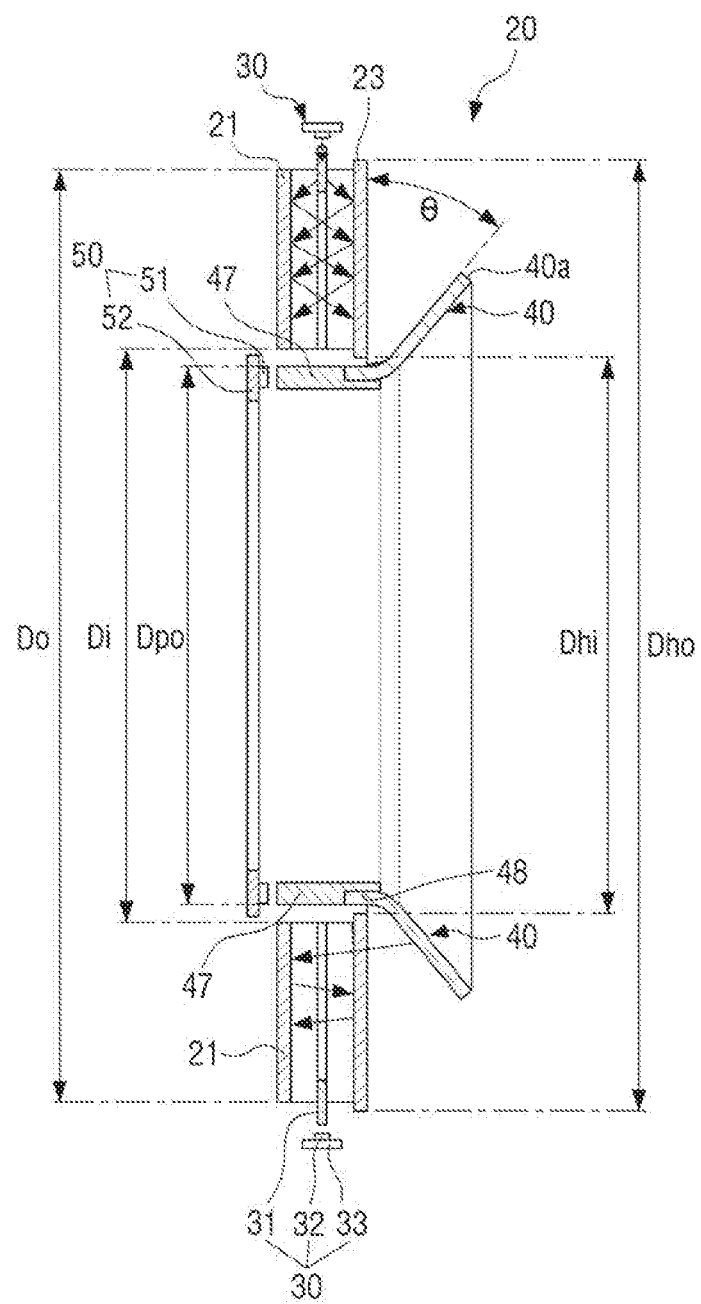
FIG. 7 is a cross-sectional view of a decorative lighting device according to an embodiment.

As shown in FIG. 7, a light guide 47 may be disposed at a front end of the cylindrical portion 43 of the pattern forming member 40. The light guide 47 may be disposed at the center of the annular half mirror 23 and may be formed to guide the light emitted from the pattern light source 50 to the pattern forming member 40. The light guide 47 may be formed in a hollow cylindrical shape corresponding to the cylindrical portion 43 of the pattern forming member 40. The outer diameter of the light guide 47 may be the same as the outer diameter of the cylindrical portion 43 of the pattern forming member 40.

A coupling portion 48, to which the pattern forming member 40 is coupled, may be provided at one end of the light guide 47. The coupling portion 48 may be formed as a step having a diameter smaller than the outer diameter of the light guide 47. The step of the coupling portion 48 may be formed to have an outer diameter corresponding to the inner circumferential surface of the cylindrical portion 43 of the pattern forming member 40.

In the embodiment described above, the separate light guide 47 is provided at the front end of the pattern forming member 40. However, the pattern forming member 40 is not limited thereto. As another example, the light guide 47 may be integrally formed with the pattern forming member 40. In other words, the cylindrical portion 43 of the pattern forming member 40 may be formed to extend by the length of the light guide 47. Thus, the light of the pattern light source 50 may be incident through the lower end of the cylindrical portion 43 of the pattern forming member 40.

The pattern light source 50 may be disposed at one end of the pattern forming member 40 and may be formed to supply light to the pattern forming member 40. When the light guide 47 is disposed at one end of the pattern forming member 40, the pattern light source 50 may be provided at the end of the light guide 47 where the pattern forming member 40 is not disposed.

The pattern light source 50 supplies light to the pattern forming member 40 so the patterns 45 of the pattern forming member 40 may pass through the annular half mirror 23 and be reflected on the annular total reflection mirror 21.

The pattern light source 50 may include a plurality of pattern LEDs 51 which face one end of the light guide 47 and are disposed at regular intervals and a pattern printed circuit board 52 on which the plurality of pattern LEDs 51 are disposed. The pattern printed circuit board 52 may be formed in an annular shape corresponding to the light guide 47.

The plurality of pattern LEDs 51 may be provided on the pattern printed circuit board 52 in a circle corresponding to the light guide 47. The pattern printed circuit board 52 may be disposed on the bottom of the circular recessed portion 11 of the case 10. Therefore, when the pattern LEDs 51 are turned on, the light emitted from the plurality of pattern LEDs 51 is incident on the light guide 47.

The light guide 47 may be formed to transmit the light incident on one end thereof to the other end thereof. Therefore, the light incident on one end of the light guide 47 may be reflected by the inner circumferential surface and the outer circumferential surface of the light guide 47, thereby being emitted through the coupling portion 48 of the light guide 47.

Because the pattern forming member 40 is coupled to the coupling portion 48 of the light guide 47, the light emitted from the coupling portion 48 of the light guide 47 is incident on the pattern forming member 40.

A reflection absorbing member 60 may be provided on the inner surface of the circular recessed portion 11 of the case 10 facing the pattern forming member 40 above the annular half mirror 23, as shown in FIG. 5. The reflection absorbing member 60 may be formed to absorb a part of light emitted from the pattern forming member 40 and reflect the rest of the light.

In the embodiment illustrated in FIGS. 3 to 5, the reflection absorbing member 60 is formed of a plurality of semi-cylindrical protrusions 61 formed at regular intervals on the inclined surface. The plurality of semi-cylindrical protrusions 61 are formed parallel to each other in the longitudinal direction of the circular recessed portion 11 of the case 10. The inclined surface of the reflection absorbing member 60 is formed to be inclined at an angle corresponding to the inclination angle θ of the diverging portion 44 of the pattern forming member 40. When the plurality of semi-cylindrical protrusions 61 are formed on the inner surface of the circular recessed portion 11 of the case 10 as described above, the plurality of semi-cylindrical protrusions 61 reflect light, and a plurality of grooves formed between the plurality of semi-cylindrical protrusions 61 absorb light.

As another example, the reflection absorbing member 60 may be formed as an inclined surface on which a reflective absorption pattern is formed. For example, the reflective absorption pattern may be formed by applying a paint to one surface of the inclined surface facing the pattern forming member 40. Specifically, matte paint and glaze paint may be alternatingly applied in a stripe form on one surface of the inclined surface to form the reflective absorption pattern. Thus, the portions of the inclined surface on which the glaze paint is applied will reflect light, and the portions of the inclined surface on which the matte paint is applied will absorb light.

When the reflection absorbing member 60 is disposed on the inner surface of the circular recessed portion 11 of the case 10 as described above, the light emitted from the pattern forming member 40 may be partially absorbed and reflected. Therefore, the decorative effect by the decorative lighting device 20 may be improved.

In addition, a protective cover 80 may be disposed between the entrance of the circular recessed portion 11 of the case 10 and the leading end 40a of the pattern forming member 40. The protective cover 80 may be disposed to prevent foreign materials from entering the space between the circular recessed portion 11 and the pattern forming member 40.

Further, the protective cover 80 may function to block the decorative lighting device 20 from being visible from the outside. Therefore, the protective cover 80 may be formed of an opaque material or a translucent material. In other words, the protective cover 80 may be formed so that when the decorative lighting device 20 is operated, the lighting is visible to the outside, and when the decorative lighting device 20 is not operated, the internal structure of the decorative lighting device 20 is not visible from the outside.

Hereinafter, the operation of the decorative lighting device 20 of the display apparatus 1 according to an embodiment will be described in detail with reference to FIG. 7.

FIG. 7 is a cross-sectional view for explaining the operation of a decorative lighting device 20 according to an embodiment.

When both the annular light source 30 and the pattern light source 50 of the decorative lighting device 20 are turned on, an infinity mirror effect in which the patterns 45 of the pattern forming member 40 (see FIGS. 6A, 6B, and 6C) are infinitely reflected by the annular total reflection mirror 21 and the annular half mirror 23 may be generated.

When the annular light source 30 is turned on, the space between the annular half mirror 23 and the annular total reflection mirror 21 becomes bright. That is, when the plurality of LEDs 32 of the annular light source 30 are turned on by the processor 90, the plurality of LEDs 32 emit light into the space between the annular half mirror 23 and the annular total reflection mirror 21.

The light emitted from the plurality of LEDs 32 may be transmitted to the space between the annular half mirror 23 and the annular total reflection mirror 21 through the annular member 31, and then reflected by the annular half mirror 23 and the annular total reflection mirror 21 as illustrated in FIG. 7. As a result, the space between the annular half mirror 23 and the annular total reflection mirror 21 becomes bright. At this time, because the annular total reflection mirror 21 and the annular half mirror 23 both reflect light, a virtual space effect is generated.

When the pattern light source 50 is turned on, light is supplied to the pattern forming member 40 so that the patterns 45 formed on the pattern forming member 40 are visible. The light reflected from the patterns 45 of the pattern forming member 40 may pass through the annular half mirror 23, and then may be reflected by the annular total reflection mirror 21.

The patterns 45 reflected by the annular total reflection mirror 21 may be reflected again by the annular half mirror 23. The annular total reflection mirror 21 and the annular half mirror 23 have reflective surfaces facing each other, so that the patterns 45 appear to be infinite by the infinity mirror effect. Therefore, the patterns 45 of the pattern forming member 40 may form a hologram effect in the virtual space between the annular half mirror 23 and the annular total reflection mirror 21.

Hereinafter, a decorative lighting device according to another embodiment that may be used in the display apparatus 1 will be described with reference to FIG. 8.

Figure 8:
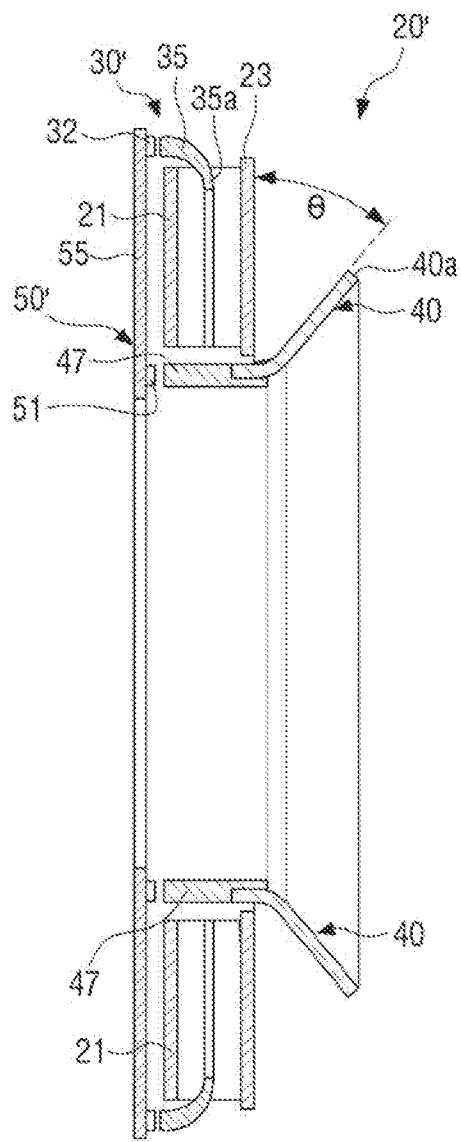
FIG. 8 is a decorative lighting device according to another embodiment.

FIG. 8 is a decorative lighting device according to another embodiment.

Referring to FIG. 8, the decorative lighting device 20' according to another embodiment may include an annular total reflection mirror 21, an annular half mirror 23, an annular light source 30', a pattern forming member 40, and a pattern light source 50'.

The annular total reflection mirror 21, the annular half mirror 23, and the pattern forming member 40 may be the same as those of the decorative lighting device 20 according to the above-described embodiment; therefore, detailed descriptions thereof are omitted.

The decorative lighting device 20' shown in FIG. 8.in which the annular light source 30' and the pattern light source 50' are formed on a single printed circuit board 55. is different from the decorative lighting device 20 according to the embodiment shown in FIG. 7 in which the annular printed circuit board 33 and the pattern printed circuit board 52 are formed separately.

The annular light source 30' may include a plurality of LEDs 32 and a curved light guide member 35.

The plurality of LEDs 32 are arranged in a circular shape at regular intervals on the printed circuit board 55. The plurality of LEDs 32 are disposed along a circle having a diameter larger than the outer diameter (Do) of the annular total reflection mirror 21 on the printed circuit board 55 disposed behind the annular total reflection mirror 21.

The curved light guide member 35 may be a curved member having a lower end facing the plurality of LEDs 32 and a leading end portion 35a being positioned at the edge of the space between the annular half mirror 23 and the annular total reflection mirror 21. In other words, the curved light guide member 35 may be formed in a substantially bell shape.

The leading end portion 35a of the curved light guide member 35 may be provided to overlap the annular total reflection mirror 21 and the annular half mirror 23. In addition, the leading end portion 35a of the curved light guide member 35 may be formed to be positioned approximately in the center between the annular total reflection mirror 21 and the annular half mirror 23.

The curved light guide member 35 may be formed of a transparent material, and thus may transmit light emitted from the plurality of LEDs 32 to the space between the annular half mirror 23 and the annular total reflection mirror 21. Both side surfaces of the curved light guide member 35 may be formed to totally reflect light, and both side surfaces of the leading end portion 35a of the curved light guide member 35 facing the annular half mirror 23 and the annular total reflection mirror 21 may be formed to emit light to the outside of the decorative lighting device 20'. Therefore, the light emitted from the plurality of LEDs 32 is transmitted to the leading end portion 35a through the curved light guide member 35, and then is emitted to the space between the annular half mirror 23 and the annular total reflection mirror 21.

The pattern light source 50' may include a plurality of pattern LEDs 51. The plurality of pattern LEDs 51 may be disposed in a circular shape on the printed circuit board 55 at regular intervals at a position closer to a center of the circuit board than the plurality of LEDs 32. In other words, the plurality of pattern LEDs 51 may be disposed along a second virtual circle having a smaller diameter than a first virtual circle in which the plurality of LEDs 32 are disposed. The second virtual circle in which the plurality of pattern LEDs 51 are arranged and the first virtual circle in which the plurality of LEDs 32 are arranged may be formed concentrically.

Further, the plurality of pattern LEDs 51 may disposed along a virtual circle having a diameter corresponding to the diameter of the light guide 47 of the pattern forming member 40.

The operation of the decorative lighting device 20' shown in FIG. 8 may be the same as the operation of the decorative lighting device 20 shown in FIG. 7, so a detailed description thereof is omitted.

Various lighting effects may be provided on the rear surface of the display apparatus 1 by using the decorative lighting devices 20 or 20'.

Hereinafter, various lighting effects that may be implemented with the decorative lighting devices 20 and 20' according to an embodiment will be described in detail.

Figure 9:
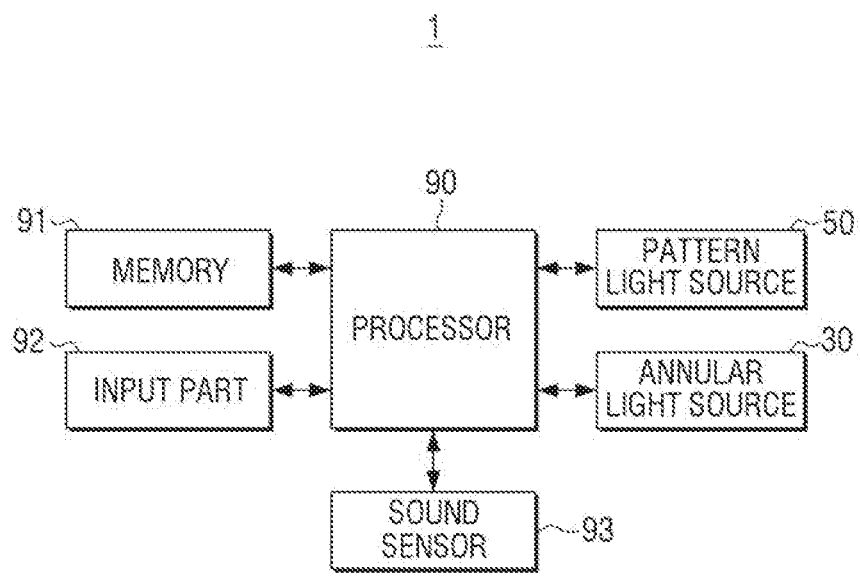
FIG. 9 is a functional block diagram of a display apparatus according to an embodiment.

FIG. 9 is a functional block diagram of a display apparatus according to an embodiment.

Referring to FIG. 9, the display apparatus may include a processor 90, a memory 91, an input part, 92, a sound sensor 93, a pattern light source 50 and an annular light sour 30. The processor 90 is electrically connected to the annular light source 30, 30' and the pattern light source 50, 50'. Accordingly, the processor 90 may individually control power to the plurality of LEDs 32 of the annular light source 30, 30'. Also, the processor 90 may individually control power to the plurality of pattern LEDs 51 of the pattern light source 50, 50'.

The processor 90 may implement various lighting effects by controlling the plurality of LEDs 32 of the annular light source 30 and the plurality of pattern LEDs 51 of the pattern light source 50.

The processor 90 may include, for example, processing circuits such as electronic circuit boards, various electronic components such as ASICs, ROMs, RAMs, and/or program modules. Alternatively, the processor 90 may be integrally formed with a main processor that controls the display panel.

The memory 91 may store programs for processing or controlling of the processor 90, as well as data for operation of the decorative lighting device 20. For example, the memory 91 may store a number of programs for driving the decorative lighting device 20 and data and instructions for the operation of the decorative lighting device 20.

The memory 91 may be accessed by the processor 90, and reading data, writing data, modifying data, deleting data, updating data, and the like may be performed by the processor 90. The memory 91 may be implemented as a storage medium inside the display apparatus 1, an external storage medium, a removable disk including a USB memory, a web server through a network, or the like.

The input part 92 may receive control commands for the decorative lighting device 20 from the user. The input part 92 may be configured to include menus displayed on the display panel and buttons to select them.

The sound sensor 93 may be provided to detect an external sound and transmit a signal to the processor 90. For example, the sound sensor 93 may be configured to detect the sound of a person clapping and output a signal. When a signal is input from the sound sensor 93, the processor 90 may control the annular light source 30 and the pattern light source 50 according to a predetermined scenario.

The processor 90 may control the annular light source 30 and the pattern light source 50 to perform various lighting scenarios such as static lighting, breath lighting, flash lighting, rainbow lighting, rotation lighting, and like.

The static lighting scenario means that the processor 90 controls the plurality of LEDs 32 of the annular light source 30 and the plurality of pattern LEDs 51 of the pattern light source 50 so that the annular light source 30 and the pattern light source 50 are always turned on.

The breath lighting scenario means that the processor 90 controls the plurality of LEDs 32 of the annular light source 30 and the plurality of pattern LEDs 51 of the pattern light source 50 so that the annular light source 30 and the pattern light source 50 are repeatedly turned off and on slowly as if breathing.

The flash lighting scenario means that the processor 90 controls the plurality of LEDs 32 of the annular light source 30 and the plurality of pattern LEDs 51 of the pattern light source 50 so that the annular light source 30 and the pattern light source 50 are turned on and off as quickly as the camera flash fires.

The rainbow lighting scenario means that the processor 90 controls the plurality of LEDs 32 of the annular light source 30 and the plurality of pattern LEDs 51 of the pattern light source 50 so that the colors of the plurality of LEDs 32 of the annular light source 30 and the plurality of pattern LEDs 51 of the pattern light source 50 continuously change to various colors.

The rotation lighting scenario refers to providing the appearance of light rotating in a circle in one direction. To perform the rotating light scenario, the processor 90 may control the annular light source 30 to sequentially turn on and off the plurality of LEDs 32 of the annular light source 30 in a clockwise direction or in a counter-clockwise direction. In addition, the processor 90 may control the pattern light source 50 to sequentially turn on and off the plurality of pattern LEDs 51 of the pattern light source 50 in a clockwise direction or in a counter-clockwise direction. In some embodiments, the processor 90 may control the annular light source 30 and the pattern light source 50 to sequentially turn on and off the plurality of LEDs 32 of the annular light source 30 and some of the plurality of pattern LEDs 51 of the pattern light source 50 in the same direction or in opposite directions.

The above-described operation scenarios of the decorative lighting device 20 are only examples, and various lighting decoration effects may be obtained by controlling the decorative lighting devices 20 and 20' in various ways.

The plurality of operation scenarios of the decorative lighting devices 20 and 20' may be stored in the memory 91. The user may select one of the plurality of operation scenarios through the input part 92. Thus, the processor 90 may operate the decorative lighting devices 20 and 20' according to the selected operation scenario.

In some embodiments, the processor 90 may control the decorative lighting devices 20 and 20' by recognizing an external sound, for example, a clapping sound. Specifically, the processor 90 may operate the decorative lighting devices 20 and 20' by controlling the annular light source 30 and the pattern light source 50 according to signals input from the sound sensor 93. In other words, the processor 90 may control on/off of the annular light source 30 and the pattern light source 50 of the decorative lighting devices 20 and 20' according to the signals input from the sound sensor 93.

For example, when a signal is input from the sound sensor 93, the processor 90 may turn on the annular light source 30 and the pattern light source 50, and then, after a predetermined time, for example, after one second elapses, the processor 90 may turn off the annular light source 30 and the pattern light source 50.

An embodiment of the display apparatus having the above-described structure may be provided with the decorative lighting device 20 on the rear surface thereof, thereby providing a decorative effect by emitting light on the rear surface of the display apparatus.

In addition, an embodiment of the display apparatus may operate the decorative lighting device 20 according to various lighting scenarios, thereby providing various lighting decoration effects.

FIG. 1 illustrates a state in which the display apparatus 1 is disposed on a floor surface such as a desk by the stand 100. However, the display apparatus 1 may be fixed to the edge of a fixed object such as a desk by using a slide clamp.

Hereinafter, an embodiment in which a slide clamp 200 for fixing the display apparatus 1 to the edge of a fixed object 201 such as a desk will be described in detail with reference to FIGS. 10 and 11.

Figure 10:
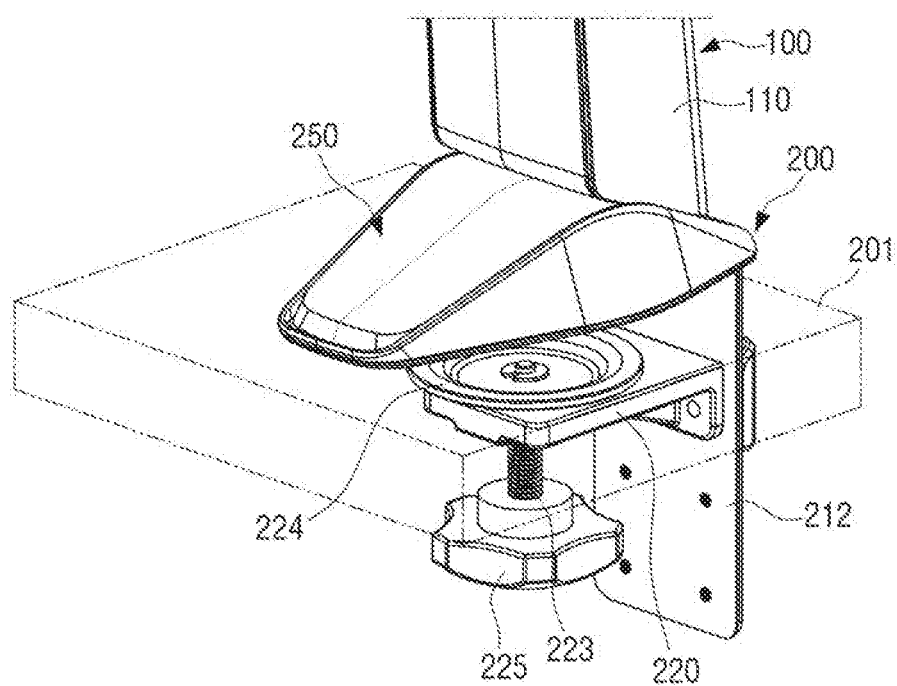
FIG. 10 is a partial perspective view illustrating a state in which a stand of a display apparatus is fixed to a desk, according to an embodiment.

FIG. 10 is a partial perspective view illustrating a state in which a stand of a display apparatus is fixed to a desk, according to an embodiment.

Referring to FIG. 10, a stand 100 configured to support the display apparatus 1 may include a neck part (or a neck) 110 and a base part (or a base) 112.

The neck part 110 may be detachably coupled to the stand coupling portion (or the stand coupler) 70 (see FIG. 2) provided at the bottom of the circular recessed portion 11 of the case 10. In detail, the upper end of the neck part 110 may be coupled to the stand coupling portion 70 of the case 10, and the lower end of the neck part 110 is detachably coupled to the base part 112 (see FIGS. 1 and 2).

The base part 112 may be formed to support the neck part 110. In the case of the embodiment shown in FIG. 10, the base part 112 may be formed as a slide clamp 200.

The slide clamp 200 may be configured to adjust the position of the neck part 110, and thus the position of the display apparatus 1. For example, the slide clamp 200 may be formed so that the display apparatus 1 may be positioned in at least three positions.

Hereinafter, an example embodiment of the slide clamp 200 of the stand 100 will be described in detail with reference to FIGS. 11 to 15.

Figure 11:
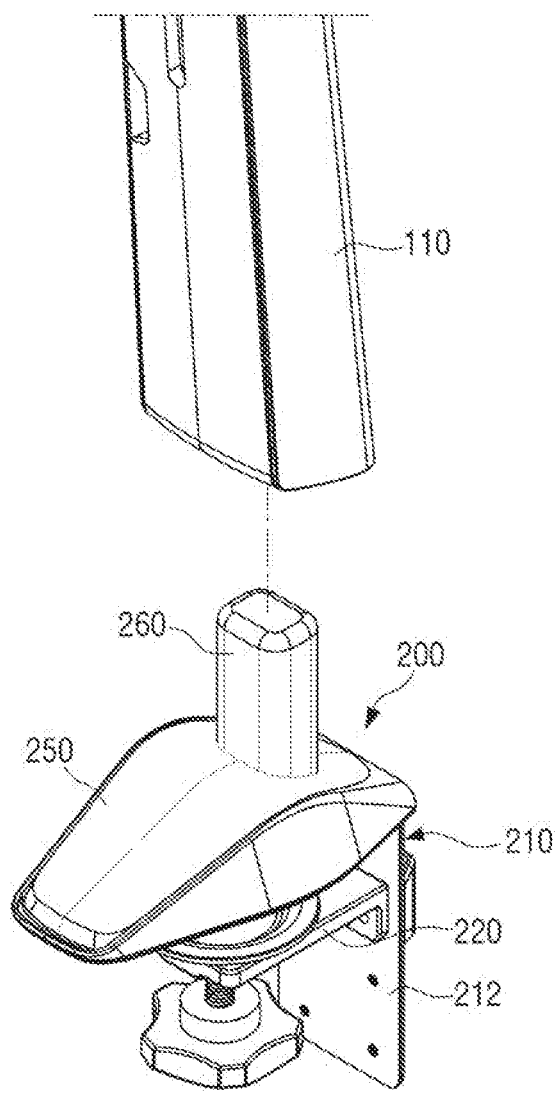
FIG. 11 is a perspective view illustrating a state in which a neck part is separated from a slide clamp in a stand according to an embodiment.
Figure 12:
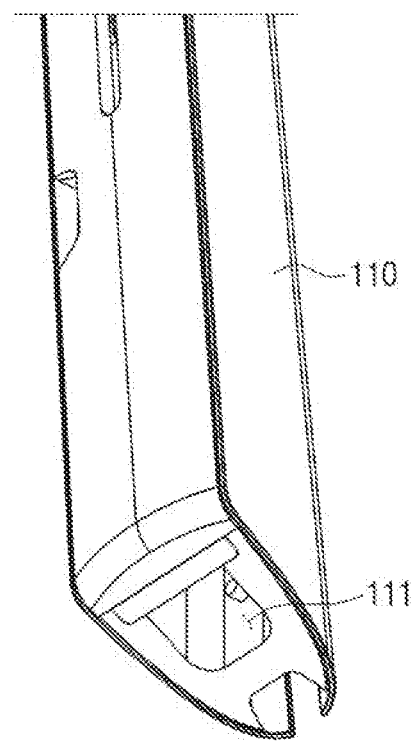
FIG. 12 is a bottom perspective view illustrating the neck part of FIG. 11.
Figure 13:
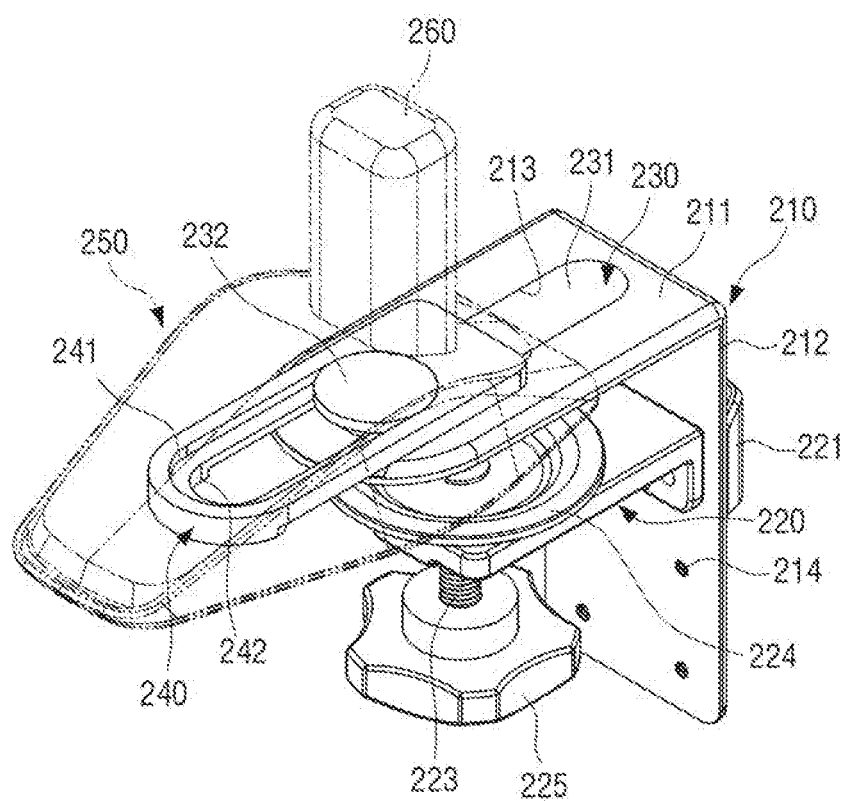
FIG. 13 is a perspective view illustrating a state in which a slide clamp is positioned in a second position according to an embodiment.
Figure 14:
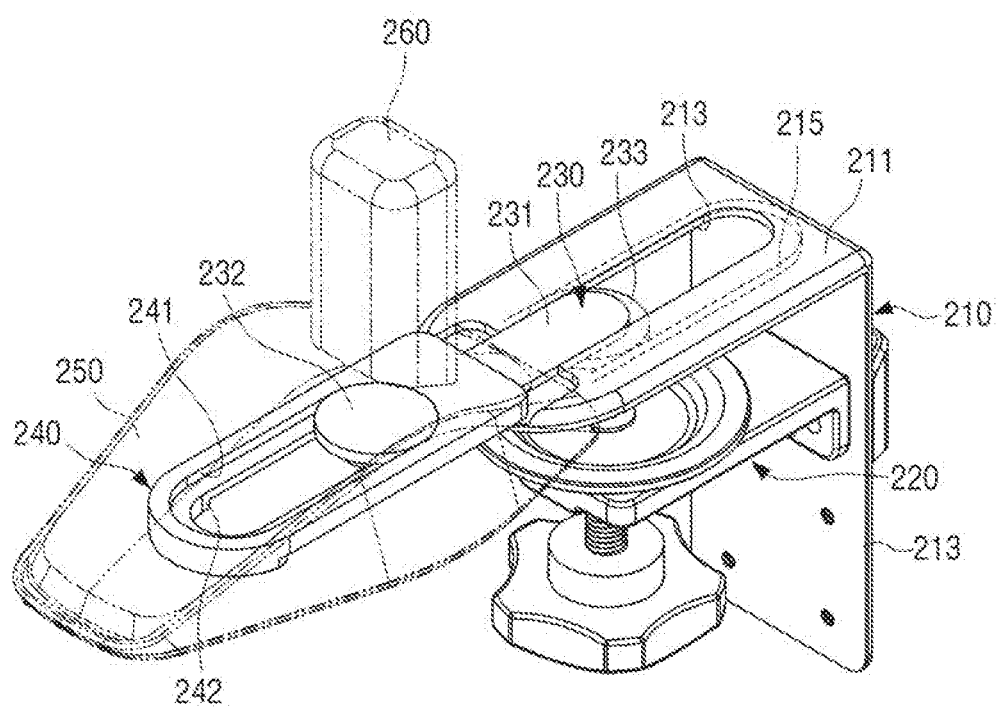
FIG. 14 is a perspective view illustrating a state in which the slide clamp is positioned in a third position according to an embodiment.
Figure 15:
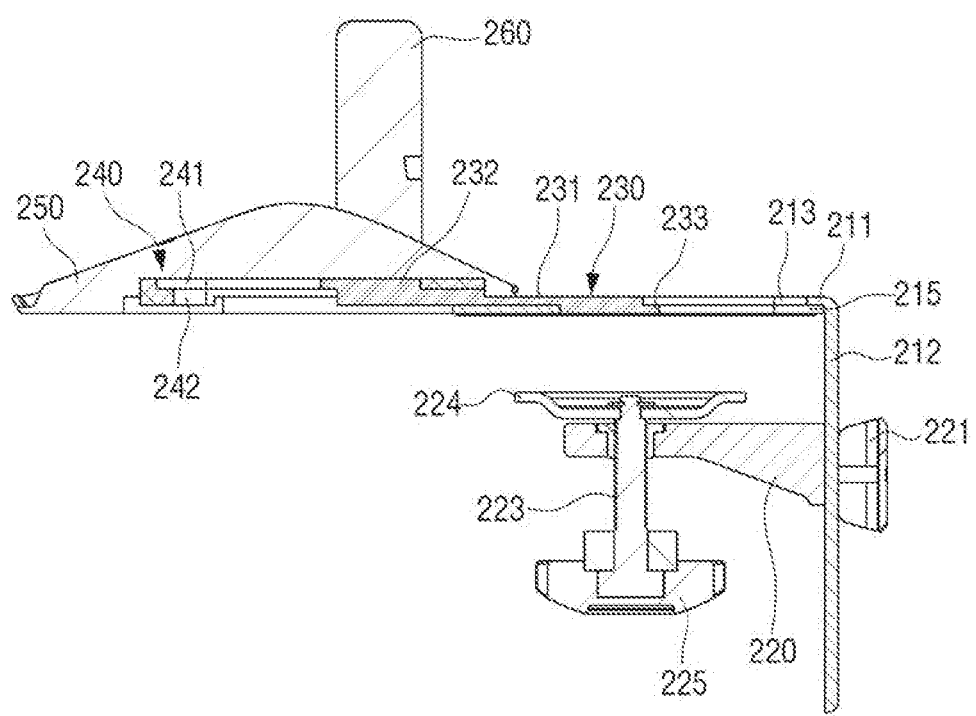
FIG. 15 is a cross-sectional view illustrating a state in which the slide clamp is positioned in a third position according to an embodiment.

FIG. 11 is a perspective view illustrating a state in which a neck part is separated from a slide clamp in a stand according to an embodiment. FIG. 12 is a bottom perspective view illustrating the neck part of FIG. 11. FIG. 13 is a perspective view illustrating a state in which a slide clamp is positioned in a second position according to an embodiment. FIG. 14 is a perspective view illustrating a state in which the slide clamp according to an embodiment is positioned in a third position according to an embodiment. FIG. 15 is a cross-sectional view illustrating a state in which the slide clamp is positioned in a third position according to an embodiment.

Referring to FIGS. 11 to 15, the slide clamp 200 may include a clamp 210, a first slide member 230, and a second slide member 240.

The clamp 210 may be configured to be fixed to the fixed object 201. The clamp 210 may include a top plate 211 and a side plate 212 that forms a right angle.

The top plate 211 may be positioned on the upper surface of the fixed object 201, and supports the first slide member 230 in a slidable relation.

The side plate 212 may extend at a right angle from one end of the top plate 211. The side plate 212 may support an adjusting plate 220 at an orientation parallel with the top plate 211. A plurality of adjusting holes 214 may be provided in the side plate 212 for adjusting the distance between the adjusting plate 220 and the top plate 211. The adjusting plate 220 may be fixed to the side plate 212 by adjusting bolts 221.

One fixing bolt 223 may be disposed in the adjusting plate 220. One end of the fixing bolt 223 may support a fixing plate 224 for fixing the fixed object 201, and the other end of the fixing bolt 223 may be provided with a knob 225.

Accordingly, when the fixed object 201 is placed between the top plate 211 of the clamp 210 and the fixing plate 224 of the adjusting plate 220, the clamp 210 may be fixed to the fixed object 201 by rotating the knob 225. When the knob 225 is rotated in the opposite direction, the clamp 210 may be separated from the fixed object 201.

The first slide member 230 may slide with respect to the top plate 211 of the clamp 210. To accommodate the sliding connecting, a first guide groove 213 may be provided on the top plate 211 of the clamp 210.

The first guide groove 213 may be formed as an elongated groove to guide the slide movement of the first slide member 230, with one end of the first guide groove 213 being open. Therefore, when the first slide member 230 is inserted into the first guide groove 213, a portion of the first slide member 230 may protrude toward the front of the first guide groove 213.

The first slide member 230 may include a slide body 231, as well as a front end support portion 232 and a rear end support portion 233 provided at opposing ends of the slide body 231.

The slide body 231 may be able to slide along the first guide groove 213 formed on the top plate 211 of the clamp 210. The slide body 231 may be formed as a substantially rectangular plate. Therefore, the width of the slide body 231 may be formed to a size corresponding to the width of the first guide groove 213.

The rear end support portion 233 may be formed at one end of the slide body 231, and may prevent the slide body 231 from falling out of the first guide groove 213 of the clamp 210. The rear end support portion 233 may protrude downward from one end of the slide body 231 to be positioned below the top plate 211 of the clamp 210 and may be formed to have a width greater than that of the first guide groove 213. When the rear end support portion 223 is formed in a disk shape, the rear end support portion 233 may be formed to have a diameter larger than the width of the first guide groove 213.

A first support guide groove 215 in which the rear end support portion 233 resides may be provided on the lower surface of the top plate 211 of the clamp 210 to guide the movement of the rear end support portion 233. The width of the first support guide groove 215 may be formed to have a size corresponding to the width or diameter of the rear end support portion 223. The length of the first support guide groove 215 may limit the moving distance of the first slide member 230.

The front end support portion 232 may be coupled to the second slide member 240. The front end support portion 232 may protrude upward from the other end of the slide body 231 to be positioned on the upper portion of the second slide member 240, and may have a diameter larger than the width of the first guide groove 213. The front end support portion 232 prevent the first slide member 230 from falling off the second slide member 240.

The second slide member 240 may be slidably connected to the first slide member 230. In addition, the second slide member 240 may be formed to stop in at least three places with respect to the clamp 210.

The second slide member 240 may be formed as a plate having a substantially rectangular shape, and may be provided with a second support guide groove 241 into which the front end support portion 232 of the first slide member 230 is inserted.

The second support guide groove 241 may be formed as an elongated hole, and may guide the front end support portion 232 of the first slide member 230 to move a predetermined distance. The length of the second support guide groove 241 may limit the distance that the second slide member 240 can slide. The width of the second support guide groove 241 may be formed in a size corresponding to the diameter of the front end support portion 232 of the first slide member 230.

A second guide groove 242 in which the slide body 231 of the first slide member 230 is inserted may be provided on the bottom surface of the second support guide groove 241. In addition, one end of the second guide groove 242 may be open to communicate with the first guide groove 213. Therefore, the slide body 231 may be inserted into the second guide groove 242 of the second slide member 240 and the first guide groove 213 of the top plate 211 of the clamp 210 to slide along the first guide groove 213 and the second guide groove 242.

A coupling block 250 may be provided on the upper surface of the second slide member 240. In other words, the second slide member 240 may be disposed on the lower surface of the coupling block 250. An insertion protrusion 260 protruding upward may be provided on the upper surface of the coupling block 250.

In the embodiment shown in FIG. 11, the insertion protrusion 260 is disposed on the upper surface of the coupling block 250. However, the insertion protrusion 260 may be formed to protrude directly from the upper surface of the second slide member 240. The insertion protrusion 260 may be formed to be coupled to the lower end of the neck part 110.

As shown in FIG. 12, an insertion groove 111 in which the insertion protrusion 260 is inserted and fixed is provided at the lower end of the neck part 110. The insertion groove 111 of the neck part 110 may be formed in a shape corresponding to the insertion protrusion 260.

For example, as shown in FIG. 11, when the insertion protrusion 260 is formed in a rectangular pillar shape, the insertion groove 111 of the neck part 110 may be formed in a rectangular groove into which the rectangular pillar is inserted.

In the embodiment shown in FIG. 11, the insertion protrusion 260 is formed in a rectangular pillar shape. However, the shape of the insertion protrusion 260 is not limited thereto. The insertion protrusion 260 may be formed in various polygonal pillar shapes or oval pillar shapes.

Hereinafter, the operation of the slide clamp 200 according to an embodiment will be described in detail with reference to FIGS. 11, 13, and 14.

FIG. 11 shows a first position in which the side plate 212 of the clamp 210 and the insertion protrusion 260 are closest to each other. In this first position, the distance between the display apparatus 1 and a user viewing the display is the largest.

In this first position, both the front end support portion 232 and the rear end support portion 223 of the first slide member 230 may be positioned on the top plate 211 of the clamp 210, and the second slide member 240 is also positioned on the top plate 211 of the clamp 210. In other words, the second slide member 240 overlaps the top plate 211 of the clamp 210, and the first slide member 230 is covered by the second slide member 240.

In this state, when the user pulls the coupling block 250 forward, the coupling block 250 may move forward, and the slide body 231 of the first slide member 230 may be exposed as illustrated in FIG. 13. In this position, the first guide groove 213 is fully occupied by the slide body 231.

The coupling block 250 may move along a length of the second support guide groove 241 of the second slide member 240. When the coupling block 250 is moved a predetermined distance, the rear end of the second support guide groove 241 may be caught by the front end support portion 232 of the first slide member 230.

This position is referred to as a second position in which the insertion protrusion 260 is spaced apart by a predetermined distance from the side plate 212 of the clamp 210. In the second position, the distance between the display apparatus 1 and the user viewing the display is closer than the first position.

In this second position, when the user applies an additional pulling force to the coupling block 250, the coupling block 250 may move further forward from the second position, and the first slide member 230 may also be moved together with the second slide member 240 of the coupling block 250, so that the first slide member 230 partially slides out of the first guide groove 213 of the top plate 211 as shown in FIG. 14.

The first slide member 230 may move along a length of the first support guide groove 215. When the first slide member 230 is moved a predetermined distance, the rear end support portion 223 of the first slide member 230 may be caught at the front end of the first support guide groove 215 as shown in FIG. 15.

This position is referred to as a third position where the insertion protrusion 260 is farthest from the side plate 212 of the clamp 210. In the third position, the distance between the display apparatus 1 and the user viewing the display is closer than the second position.

When the display apparatus 1 is supported by the slide clamp 200 having the above-described structure, the user may easily adjust the position of the display apparatus 1 by moving the coupling block 250 of the slide clamp 200.

Therefore, a distance between the user and the display apparatus 1 may be easily adjusted using the slide clamp 200.

In addition, the display apparatus 1 may be supported by using a fixing base 120 without using the slide clamp 200.

The fixing base 120 may include an insertion protrusion 125 that is inserted into and fixed to the insertion groove 111 of the neck part 110 of the stand 100. An example of the fixing base 120 is illustrated in FIG. 16.

Figure 16:
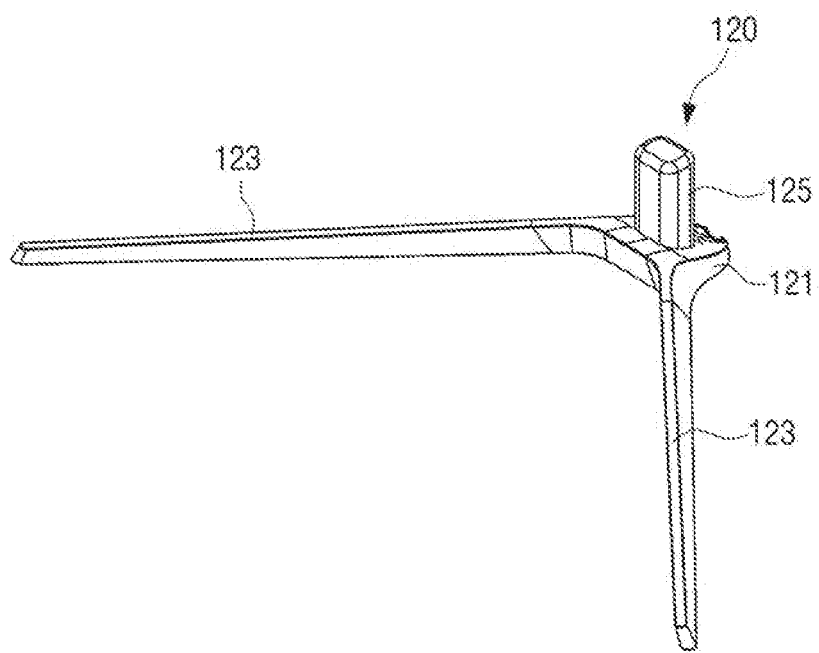
FIG. 16 is a perspective view illustrating a fixing base of a stand according to an embodiment.

FIG. 16 a perspective view illustrating a fixing base of a stand according to an embodiment.

Referring to FIG. 16, the fixing base 120 may include two legs 123 extending from the center portion 121 and the insertion protrusion 125.

The two legs 123 may extended to form an obtuse angle from both side surfaces of the center portion 121 of the fixing base 120. The two legs 123 may be spaced apart from each other at an angle of more than 90 degrees and less than 180 degrees to stably support the display apparatus 1.

The insertion protrusion 125 may protrude upward from the center portion 121, and may be formed in a shape that may be fixed by being inserted into the insertion groove 111 provided at the lower end of the neck part 110. As an example, the insertion protrusion 125 may be formed in a rectangular pillar shape as illustrated in FIG. 16. However, the shape of the insertion protrusion 125 is not limited thereto. The insertion protrusion 125 may be formed in various polygonal pillar shapes or oval pillar shapes.

When the insertion protrusion 125 of the fixing base 120 and the insertion protrusion 260 of the slide clamp 200 formed in the same shape, and the neck part 110 is provided with the insertion groove 111 in which the insertion protrusions 125 and 260 may be inserted into and fixed to, the slide clamp 200 and the fixing base 120 may be used interchangeably as needed to support the display apparatus 1.

For example, the user may support the display apparatus 1 using the fixing base 120 as the base part 112 as illustrated in FIG. 1. If necessary, the user may support the display apparatus 1 using the slide clamp 200 as illustrated in FIG. 10.

When supporting the display using the slide clamp 200, the user may fix the display apparatus 1 to the slide clamp 200 by separating the insertion protrusion 125 of the fixing base 120 from the insertion groove 111 of the neck part 110, and then inserting the insertion protrusion 260 of the slide clamp 200 into the insertion groove 111 of the neck part 110.

Although embodiments of the disclosure have been illustrated and described hereinabove, the disclosure is not limited to the abovementioned specific embodiments, but may be variously modified by those skilled in the art to which the disclosure pertains without departing from the gist of the disclosure as disclosed in the accompanying claims. These modifications should also be understood to fall within the scope of the disclosure.

What is claimed is:

1. A display apparatus comprising:
   a display panel;
   a case in which the display panel is accommodated, the case having a rear surface including a circular recessed portion;
   an annular total reflection mirror disposed in the circular recessed portion;
   an annular half mirror disposed in the circular recessed portion on an outer side of the annular total reflection mirror;
   an annular light source disposed in the circular recessed portion between the annular total reflection mirror and the annular half mirror;
   a pattern forming member disposed in the circular recessed portion on an outer side of the annular half mirror, the pattern forming member being inclined at an acute angle with respect to the annular half mirror being formed of a transparent material, and including a pattern provided on at least one surface thereof; and
   a pattern light source configured to supply light to the pattern forming member so that the pattern is reflected on the annular total reflection mirror,
   wherein when the annular light source and the pattern light source are turned on, the pattern of the pattern forming member is reflected between the annular total reflection mirror and the annular half mirror.

2. The display apparatus as claimed in claim 1, wherein the pattern forming member comprises a light guide disposed in a central aperture of the annular half mirror and having a hollow cylindrical shape, and
   wherein the pattern light source is disposed at one end of the light guide.

3. The display apparatus as claimed in claim 2, wherein the pattern light source comprises:
   a plurality of pattern light emitting diodes (LEDs) facing the one end of the light guide and disposed at regular intervals; and
   a pattern printed circuit board on which the plurality of pattern LEDs are disposed.

4. The display apparatus as claimed in claim 1, wherein the pattern is provided on a front surface and a rear surface of the pattern forming member.

5. The display apparatus as claimed in claim 1, wherein the pattern forming member has a funnel shape that tapers outward, and
   wherein a diameter of an outer end of the pattern forming member is less than a diameter of a circle located at a center between an inner diameter of the annular half mirror and an outer diameter of the annular half mirror.

6. The display apparatus as claimed in claim 1, wherein the annular light source comprises:
   an annular member disposed between the annular half mirror and the annular total reflection mirror, the annular member being configured to guide light;
   a plurality of light emitting diodes (LEDs) disposed at regular intervals along an outer circumferential surface of the annular member, the plurality of LEDs configured to emit light toward the outer circumferential surface of the annular member; and
   an annular printed circuit board on which the plurality of LEDs are disposed.

7. The display apparatus as claimed in claim 1, wherein the pattern forming member is inclined at an angle within a range of 30 degrees to 70 degree with respect to the annular half mirror.

8. The display apparatus as claimed in claim 1, wherein the annular light source and the pattern light source are provided on a single printed circuit board.

9. The display apparatus as claimed in claim 8, wherein the annular light source comprises:
   a plurality of first light emitting diodes (LEDs) disposed circumferentially around the printed circuit board at regular intervals; and
   a curved light guide member having one end facing the plurality of first LEDs and another end positioned between the annular half mirror and the annular total reflection mirror,
   wherein the curved light guide member is configured to guide light emitted from the plurality of first LEDs between the annular total reflection mirror and the annular half mirror.

10. The display apparatus as claimed in claim 9, wherein the pattern light source comprises a plurality of second LEDs disposed circumferentially around the printed circuit board at regular intervals, the plurality of second LEDs forming a circle having a smaller diameter than a circle formed by the plurality of first LEDs.

11. The display apparatus as claimed in claim 1, further comprising a processor configured to control the annular light source and the pattern light source.

12. The display apparatus as claimed in claim 11, wherein the processor is further configured to control the annular light source and the pattern light source to perform at least one of static lighting, breath lighting, flash lighting, rainbow lighting, and rotation lighting.

13. The display apparatus as claimed in claim 11, further comprising a sound sensor configured to detect an external sound,
   wherein the processor is further configured to control turn on and off the annular light source and the pattern light source based on a signal input from the sound sensor.

14. The display apparatus as claimed in claim 1, further comprising:

a stand coupler provided at a bottom of the circular recessed portion of the case; and a stand configured to be coupled to the stand coupler and to support the case.

15. The display apparatus as claimed in claim 14, wherein the stand comprises:

a neck detachably coupled to the stand coupler; and a base detachably coupled to a lower end of the neck.

16. The display apparatus as claimed in claim 15, wherein the base comprises:

a center portion;

two legs extending from the center portion at an obtuse angle with respect to each other; and an insertion protrusion extending upwardly from the center portion, wherein the lower end of the neck defines an insertion groove in which the insertion protrusion is inserted.

17. The display apparatus as claimed in claim 15, wherein the base comprises:

a clamp configured to be fixed to a fixed object, the clamp having a top plate;

a first slide member slidably connected to the top plate of the clamp;

a second slide member slidably connected to the first slide member; and an insertion protrusion protruding from the second slide member, wherein the lower end of the neck defines an insertion groove in which the insertion protrusion is inserted.

18. The display apparatus as claimed in claim 17, wherein the second slide member is configured to lock in at least three places with respect to the clamp.

19. The display apparatus as claimed in claim 17, wherein the first slide member comprises:

a slide body configured to slide along a first guide groove formed on the top plate of the clamp;

a rear end support portion provided at a first end of the slide body, the rear end support portion being positioned below the top plate of the clamp and having a diameter greater than a width of the first guide groove; and a front end support portion provided at a second end of the slide body, the front end support portion having a diameter greater than the width of the first guide groove and being coupled to the second slide member.

20. The display apparatus as claimed in claim 19, wherein the second slide member comprises:

a support guide groove formed in an elongated hole defined by the second slide member, the support guide groove being configured to receive the front end support portion of the first slide member; and a second guide groove formed on a bottom surface of the support guide groove, the second guide groove being configured to receive the slide body of the first slide member.

* * * * *